(12) United States Patent  
Hokomoto et al.

(10) Patent No.: US 7,884,420 B2  
(45) Date of Patent: Feb. 8, 2011

(54) SEMICONDUCTOR DEVICE AND METHOD OF MANUFACTURING THE SAME

(75) Inventors: Yoshitaka Hokomoto, Hyogo-Ken (JP); Akio Takano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 12/332,579

(22) Filed: Dec. 11, 2008

(65) Prior Publication Data

US 2009/0166732 A1    Jul. 2, 2009

(30) Foreign Application Priority Data

Dec. 28, 2007    (JP) .............................. 2007-339448

(51) Int. Cl.  
*H01L 29/76* (2006.01)
(52) U.S. Cl. ....................... 257/330; 257/288; 257/328; 257/329; 257/E29.201
(58) Field of Classification Search ................. 257/288, 257/328, 329, 330, 341, 347, 365  
See application file for complete search history.

(56) References Cited

U.S. PATENT DOCUMENTS

| | | | |
|---|---|---|---|
| 5,801,408 A * | 9/1998 | Takahashi ................... 257/212 |
| 6,754,105 B1 * | 6/2004 | Chang et al. ........... 365/185.18 |
| 6,930,355 B2 | 8/2005 | Matsuki et al. | |
| 2003/0075759 A1 | 4/2003 | Kawano et al. | |
| 2004/0026753 A1 | 2/2004 | Matsuki et al. | |
| 2005/0189582 A1 * | 9/2005 | Mikolajick .................. 257/324 |
| 2007/0023829 A1 * | 2/2007 | Burke et al. ................. 257/330 |

FOREIGN PATENT DOCUMENTS

| | | |
|---|---|---|
| JP | 2003-92405 | 3/2003 |
| JP | 2003-332576 | 11/2003 |

* cited by examiner

*Primary Examiner*—Wai-Sing Louie  
(74) *Attorney, Agent, or Firm*—Oblon, Spivak, McClelland, Maier & Neustadt, L.L.P.

(57) ABSTRACT

A semiconductor device according to an embodiment of the present invention has a transistor section which includes a trench gate type transistor, and a gate line section which includes a part provided between transistor sections. The device includes a semiconductor substrate, a semiconductor layer formed on the semiconductor substrate, a base layer formed in the semiconductor layer, and provided with trenches in the transistor section and the gate line section, the trenches in the transistor section extending in a first direction parallel to a direction in which the transistor extends, the trenches in the bit line section extending in a second direction perpendicular to the first direction, and the trenches in the transistor section penetrating the base layer to reach the semiconductor layer, a source layer formed in the semiconductor layer in the transistor section, the source layer being located on the base layer, a gate insulator formed on surfaces of the base layer and the semiconductor layer exposed to the trenches in the transistor section and the gate line section, and on an upper surface of the base layer between the trenches in the gate line section, a gate line layer formed on the gate insulator, and including a part buried in the trenches in the transistor section, an inter layer dielectric formed on the gate line layer, and a source line layer formed on the inter layer dielectric, and electrically connected to the source layer in the transistor section.

15 Claims, 6 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2007-339448, filed on Dec. 28, 2007, the entire contents of which are incorporated herein by reference.

BACKGROUND OF THE INVENTION

1. Field of the Invention

The present invention relates to a semiconductor device and a method of manufacturing the same.

2. Background Art

A power MOSFET is designed for dealing with large electric power. An example of the power MOSFET includes a trench gate type MOSFET (for example, refer to JP-A 2003-92405 (KOKAI)). Performance required for the power MOSFET changes with a circuit in which the power MOSFET is provided. For example, when using the power MOSFET as a load switch, low on-resistance performance is required in many cases so as to reduce conduction loss. On the other hand, when using the power MOSFET for high speed switching in a DC-DC converter and the like, plural performances such as low on-resistance performance, low capacitance performance, and low gate resistance performance, are required in many cases so as to improve conversion efficiency.

An LSI provided with the trench gate type MOSFET will be described. Generally, a substrate region of such LSI includes an FET section (transistor section) for controlling a current, and a gate line section for transmitting a gate signal. The FET section largely influences on on-resistance or capacitance, and the gate line section largely influences on gate resistance. With respect to such LSI, efforts to satisfy required performance have been continued by improving the on-resistance, capacitance, and gate resistance. With respect to the on-resistance, reduction of resistance of a source line has been advanced by improving assembly techniques. For example, it has become common to adopt strap structure instead of wire structure for leading a source electrode (for example, refer to JP-A 2003-332576 (KOKAI)).

Reduction of the gate resistance with reducing the on-resistance is achieved, for example, by reducing the gate resistance by certain means with reducing the source resistance by the strap structure. The reduction of the gate resistance can be achieved, for example, by forming a silicide layer on a polysilicon layer which forms the gate line, so as to reduce the resistance of the line itself. However, it is difficult to achieve, only with this method, the low resistance that satisfies enough the required performance. The reduction of the gate resistance can be also achieved, for example, by extending the width of the gate line or by increasing the number of gate lines. However, since it is necessary in this method to reduce the FET section as its trade off, it leads to an increase in the on-resistance.

SUMMARY OF THE INVENTION

An aspect of the present invention is, for example, a semiconductor device having a transistor section which includes a trench gate type transistor, and a gate line section which includes a part provided between transistor sections, the device including a semiconductor substrate, a semiconductor layer formed on the semiconductor substrate, a base layer formed in the semiconductor layer, and provided with trenches in the transistor section and the gate line section, the trenches in the transistor section extending in a first direction parallel to a direction in which the transistor extends, the trenches in the bit line section extending in a second direction perpendicular to the first direction, and the trenches in the transistor section penetrating the base layer to reach the semiconductor layer, a source layer formed in the semiconductor layer in the transistor section, the source layer being located on the base layer, a gate insulator formed on surfaces of the base layer and the semiconductor layer exposed to the trenches in the transistor section and the gate line section, and on an upper surface of the base layer between the trenches in the gate line section, a gate line layer formed on the gate insulator, and including a part buried in the trenches in the transistor section, an inter layer dielectric formed on the gate line layer, and a source line layer formed on the inter layer dielectric, and electrically connected to the source layer in the transistor section.

Another aspect of the present invention is, for example, a method of manufacturing a semiconductor device having a transistor section which includes a trench gate type transistor, and a gate line section which includes a part provided between transistor sections, the method including forming a semiconductor layer on a semiconductor substrate, forming a base layer in the semiconductor layer, forming a source layer in the semiconductor layer in the transistor section, the source layer being formed on the base layer, providing the base layer with trenches in the transistor section and the gate line section, the trenches in the transistor section extending in a first direction parallel to a direction in which the transistor extends, the trenches in the bit line section extending in a second direction perpendicular to the first direction, the trenches in the transistor section penetrating the base layer to reach the semiconductor layer, and the trenches in the transistor section and the trenches in the gate line section being formed simultaneously or in order, forming a gate insulator on surfaces of the base layer and the semiconductor layer exposed to the trenches in the transistor section and the gate line section, and on an upper surface of the base layer between the trenches in the gate line section, forming a gate line layer on the gate insulator to bury a part of the gate line layer in the trenches in the transistor section, forming an inter layer dielectric on the gate line layer, and forming a source line layer on the inter layer dielectric to electrically connect the source line layer to the source layer in the transistor section.

DESCRIPTION OF THE EMBODIMENTS

Embodiments of the present invention will be described with reference to the drawings.

First Embodiment

Figure 1:
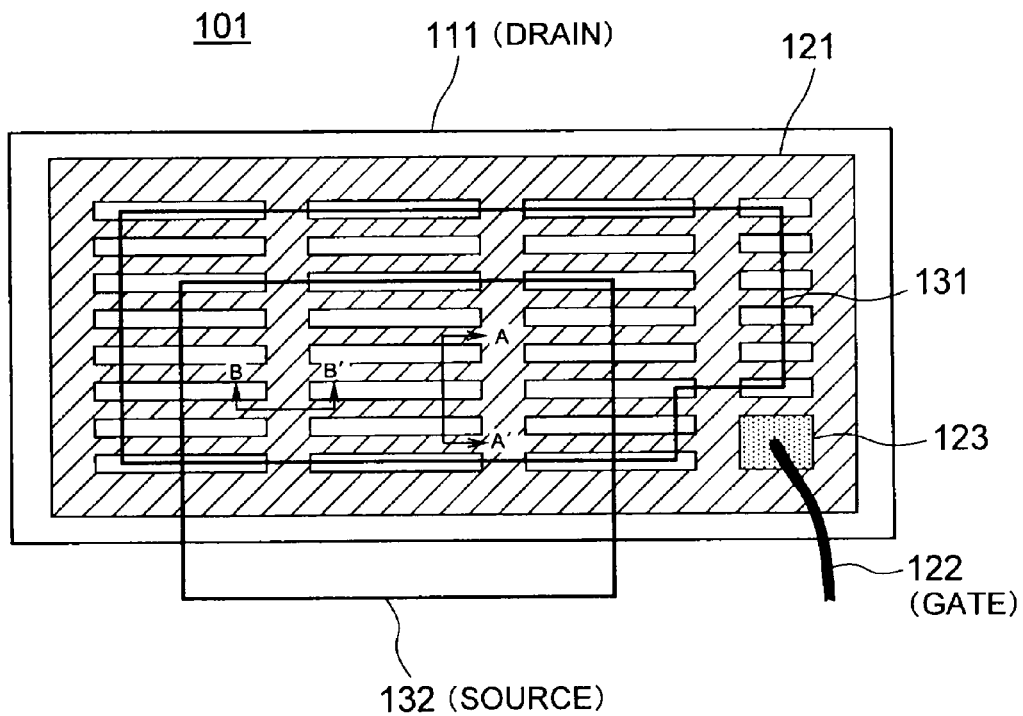
FIG. 1 is a top view of a semiconductor device according to a first embodiment.

FIG. 1 is a top view of a semiconductor device 101 according to a first embodiment. The semiconductor device 101 in FIG. 1 is an LSI including a trench gate type MOSFET. FIG. 1 shows, as components of the semiconductor device 101, an IC chip 111, a gate line 121, a gate wire 122, a gate pad 123, a source metal 131, and a source strap 132.

In this way, a strap structure is adopted in the semiconductor device 101 in FIG. 1 for leading a source electrode. In the semiconductor device 101 in FIG. 1, a gate electrode, a source electrode, and a drain electrode are led from the gate wire 122, source strap 132, and IC chip 111, respectively. The gate wire 122 is electrically connected to the gate line 121 through the gate pad 123. The source strap 132 is electrically connected to the source metal 131. An A-A' section and a B-B' section shown in FIG. 1 will be mentioned later. The B-B' line direction (horizontal direction) is an example of a first direction in the present invention, and corresponds to a direction in which the trench gate type MOSFET extends. The A-A' line direction (vertical direction) is an example of a second direction in the present invention, and corresponds to a direction perpendicular to the B-B' line direction.

Figure 2:
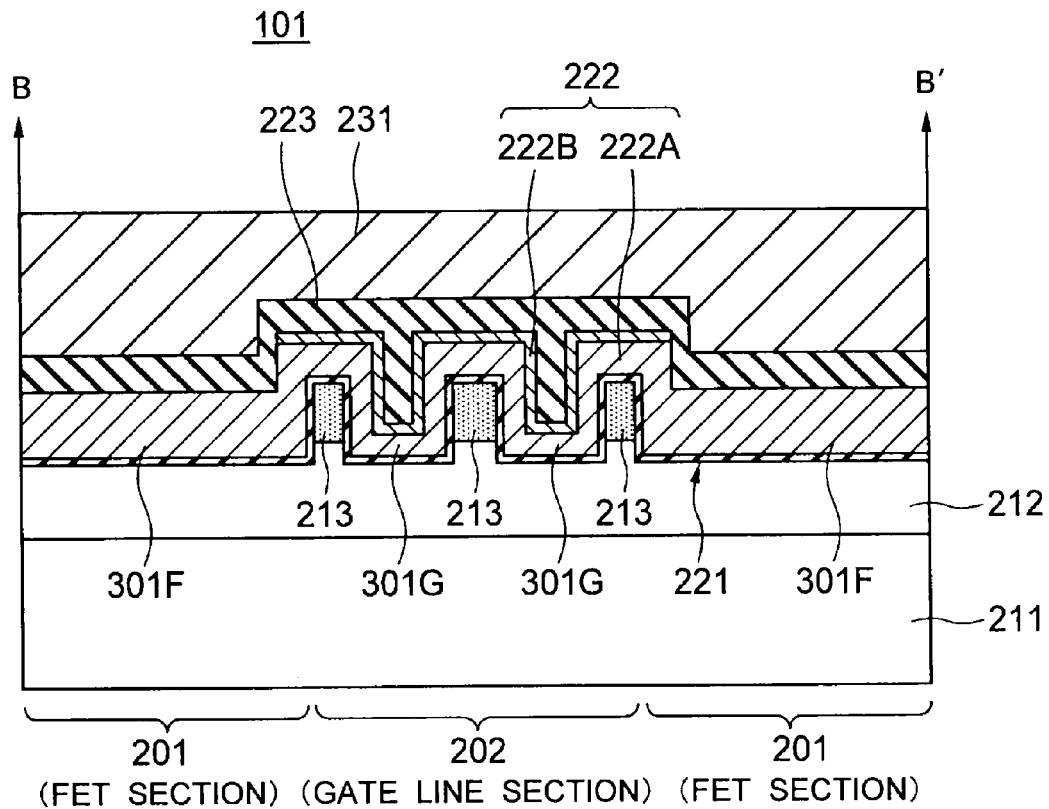
FIG. 2 is a sectional side view of the semiconductor device in FIG. 1.

FIG. 2 is a sectional side view of the semiconductor device 101 in FIG. 1. FIG. 2 is a sectional view of the B-B' section in FIG. 1. As shown in FIG. 2, the semiconductor device 101 has an FET section (transistor section) 201 which includes the trench gate type MOSFET, and a gate line section 202 which includes a part provided between FET sections 201.

The semiconductor device 101 includes a semiconductor substrate 211, an epitaxial layer 212 as an example of a semiconductor layer, a base layer 213, a gate insulator 221, a gate line layer 222, an inter layer dielectric 223, and a source metal layer 231 as an example of a source line layer. All these components are provided in the FET section 201 and the gate line section 202. The source metal layer 231 is shown also in FIG. 1 as the source metal 131.

The semiconductor substrate 211 in this embodiment is an N+ type semiconductor substrate. The semiconductor substrate 211 in this embodiment is an Si (silicon) substrate. However, the semiconductor substrate 211 may be, for example, a GaAs substrate, a GaN substrate, a SiGe substrate, a SiC substrate, or a C substrate.

The epitaxial layer 212 is formed on the semiconductor substrate 211. The epitaxial layer 212 in this embodiment is an N-type semiconductor layer.

The base layer 213 is formed in the epitaxial layer 212. The base layer 213 in this embodiment is a P type layer. The base layer 213 is formed on the surface of the epitaxial layer 212 by implanting P type impurities onto the surface of the epitaxial layer 212. As shown in FIG. 2, the base layer 213 is provided with trenches 301. In this embodiment, the base layer 213 in the FET section 201 is provided with trenches 301, and the base layer 213 in the gate line section 202 is also provided with trenches 301. In FIG. 2, the trenches 301 in the FET section 201 are indicated by 301F, and the trenches 301 in the gate line section 202 are indicated by 301G. In this embodiment, the depth of the trenches 301G in the gate line section 202 is substantially the same as the depth of the trenches 301F in the FET section 201. This has an advantage that it is possible to form simultaneously the trenches 301F and 301G.

The trenches 301F are provided in the FET section 201, and extend in the B-B' line direction (horizontal direction in FIG. 1). On the other hand, the trenches 301G are provided in the gate line section 202, and extend in the A-A' line direction (vertical direction in FIG. 1). In this embodiment, the trenches 301F and 301G penetrate the base layer 213 to reach the epitaxial layer 212. In this embodiment, the trenches 301F and the trenches 301G are formed simultaneously by the same etching process. Thereby, the depth of the trenches 301G is made substantially equal to the depth of the trenches 301F. On the other hand, the trenches 301F and the trenches 301G may be formed in order.

The gate insulator 221 is formed on the base layer 213. The gate insulator 221 is formed on the bottoms and sides of the trenches 301F and 301G, and out of the trenches 301F and 301G. On the bottoms and sides of the trenches 301F and 301G, the gate insulator 221 is formed on the surfaces of the base layer 213 and the epitaxial layer 212 exposed to the trenches 301F, and on the surfaces of the base layer 213 and the epitaxial layer 212 exposed to the trenches 301G. Out of the trenches 301F and 301G, the gate insulator 221 is formed on the upper surface of the base layer 213 between the trenches 301G, and on the upper surface of the base layer 213 between the trenches 301G and the trenches 301F. The gate insulator 221 in this embodiment is a silicon oxide layer.

The gate line layer 222 is formed on the gate insulator 221. The gate line layer 222 is formed in the trenches 301F and 301G and out of the trenches 301F and 301G, and has a part buried in the trenches 301F and 301G. In this embodiment, the gate line layer 222 in the FET section 201 is a monolayer including one line layer 222A. Further, the gate line layer 222 in the FET section 201 serves as a gate electrode for forming a channel layer in an opposing part in the base layer 213 in the FET section 201. On the other hand, in this embodiment, the gate line layer 222 in the gate line section 202 is a multilayer including two line layers 222A and 222B having different specific resistances. The line layer 222A in this embodiment is a polysilicon layer, and is formed on the insulator 221. The line layer 222B in this embodiment is a silicide layer, and is formed on the line layer 222A. The line layer 222B in this embodiment is a Ti (titanium) silicide layer. The line layer 222B may be, for example, a metal layer. The line layers 222A and 222B are examples of first and second line layers, respectively. The gate line layer 222 in the gate line section 202 may be a multilayer including three or more line layers whose specific resistances are different one another.

As described above, the gate line layer 222 in the gate line section 202 includes the line layers 222A and 222B. In the gate line section 202, the line layer 222A is formed in the trenches 301G, between the trenches 301G, and between the trenches 301G and the trenches 301F. The line layer 222A has a part buried in the trenches 301G. Similarly, in the gate line section 202, the line layer 222B is formed in the trenches 301G, between the trenches 301G, and between the trenches 301G and the trenches 301F. The line layer 222B has a part buried in the trenches 301G.

In the gate line section 202, the line layer 222A is formed to cover the surface of the bottoms and sides of the trenches 301G. Further, in the trenches 301G, the surface of the line layer 222A on the source metal layer 231 side has a shape along the trenches 301G, similar to the surface of the line layer 222A on the semiconductor substrate 211 side. Therefore, the line layer 222A in each trench 301G has a U-shaped cross section, in side section perpendicular to the A-A' line direction.

Further, in the gate line section 202, the line layer 222B is formed along the surface of the line layer 222A. Therefore, the line layer 222A in each trench 301G also has a U-shaped cross section, in side section perpendicular to the A-A' line direction.

The inter layer dielectric 223 is formed on the gate line layer 222. The inter layer dielectric 223 is formed in the trenches 301F and 301G, and out of the trenches 301F and 301G. In the gate line section 202, the inter layer dielectric 223 is formed in the trenches 301G, between the trenches 301G, and between the trenches 301G and the trenches 301F. The inter layer dielectric 223 in this embodiment is a silicon oxide layer.

The source metal layer 231 is formed on the inter layer dielectric 223. The gate line layer 222 and source metal layer 231 are electrically insulated by the inter layer dielectric 223. The source metal layer 231 in this embodiment is an Al (aluminum) layer.

Figure 3:
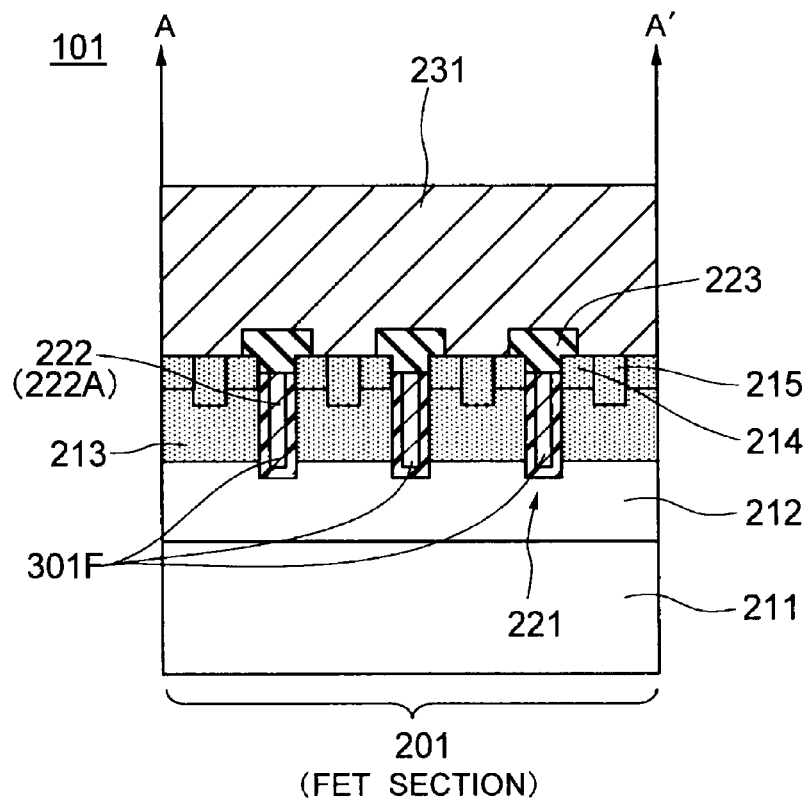
FIG. 3 is a sectional side view of the semiconductor device in FIG. 1.

FIG. 3 shows the FET section 201 in an A-A' section in FIG. 1. FIG. 3 shows the semiconductor substrate 211, epitaxial layer 212, base layer 213, gate insulator 221, gate line layer 222, inter layer dielectric 223, and source metal layer 231 similarly to FIG. 2. FIG. 3 further shows a source layer 214 and a contact layer 215.

The source layer 214 is formed in the epitaxial layer 212 in the FET section 201, and located on the base layer 213. The source layer 214 in this embodiment is an N+ type layer. The source layer 214 is formed on the surface of the epitaxial layer 212 by implanting high-concentration N type impurities onto the surface of the epitaxial layer 212. As shown in FIG. 3, the source layer 214 is in contact with a side and a bottom of the inter layer dielectric 223 and a bottom of the source metal layer 231. Thus, the source metal layer 231 is electrically connected to the source layer 214 in the FET section 201.

The contact layer 215 is formed in the epitaxial layer 212 in the FET section 201, and located at a side of the source layer 214 on the base layer 213. The contact layer 215 in this embodiment is a P+ type layer. The contact layer 215 is formed on the surface of the epitaxial layer 212 by implanting high-concentration P type impurities onto the surface of the epitaxial layer 212. As shown in FIG. 3, the contact layer 215 is in contact with a side of the source layer 214 and a bottom of the source metal layer 231. Thus, the contact layer 215 is electrically connected to the contact layer 215 in the FET section 201.

As shown in FIG. 3, in the FET section 201, the gate insulator 221 covers the bottoms and sides of the trenches 301G, and the gate line layer 222 is buried in the trenches 301G on the gate insulator 221. Further, in the FET section 201, the inter layer dielectric 223 covers the upper surface of the gate line layer 222.

Figure 4:
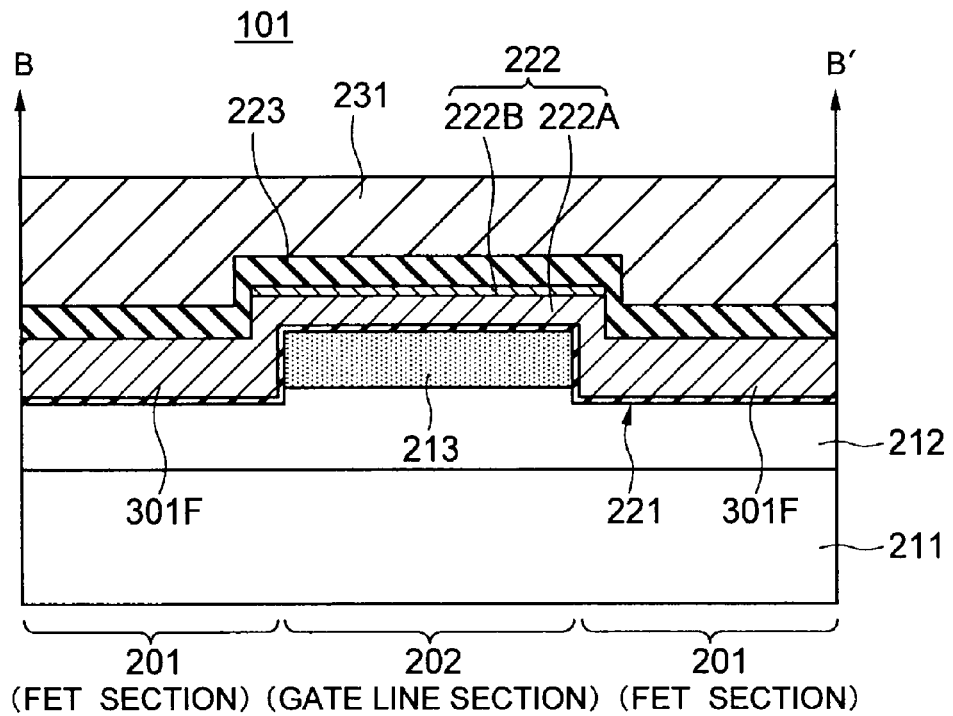
FIG. 4 is a sectional side view of a semiconductor device of a comparative example.

FIG. 4 is a sectional side view of a semiconductor device 101 of a comparative example. In the comparative example, trenches 301 are formed only in the FET section 201. On the other hand, in this embodiment, the trenches 301 are formed in the FET section 201 and the gate line section 202.

In this way, in this embodiment, the trenches 301 are formed also in the gate line section 202. Thereby, the surface area of the gate line layer 222 in the gate line section 202 is increased, so that gate resistance is reduced. In other words, in side section perpendicular to the A-A' line direction, the cross-sectional area of the line layer 222B in the gate line section 202 is increased, so that the gate resistance is reduced. Furthermore, according to this embodiment, the surface area of the gate line layer 222 in the gate line section 202 (i.e., the cross-sectional area of the line layer 222B in the gate line section 202) can be increased without reducing the FET section 201. For this reason, in this embodiment, it is possible to reduce the gate resistance without reducing the FET section 201. Furthermore, in this embodiment, since a strap structure is adopted for leading a source electrode, on-resistance is suppressed comparatively low.

Further, in this embodiment, the gate line layer 222 in the gate line section 202 includes the two line layers 222A and 222B having different specific resistances. Therefore, in this embodiment, it is possible to reduce the gate resistance by forming, on the line layer 222A, the line layer 222B having lower specific resistance than that of the line layer 222A. This advantageous effect is further exhibited as the surface area of the gate line layer 222 in the gate line section 202 becomes larger. This is the same even when the gate line layer 222 in the gate line section 202 includes three or more line layers whose specific resistances are different one another. In this embodiment, a polysilicon layer is adopted as the line layer 222A, and a silicide layer having specific resistance lower than that of polysilicon is adopted as the line layer 222B.

FIGS. 5A to 5G show a manufacturing process of the semiconductor device 101 according to the first embodiment.

Figure 5A:
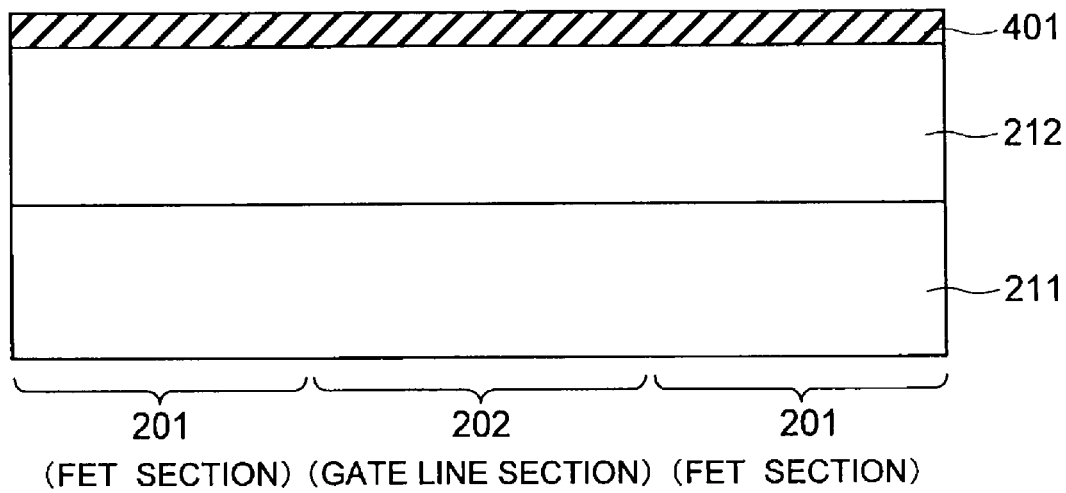
FIGS. 5A to 5G show a manufacturing process of the semiconductor device according to the first embodiment.

First, as shown in FIG. 5A, an epitaxial layer 212 is formed on a semiconductor substrate 211. In this embodiment, the semiconductor substrate 211 is an N+ type semiconductor substrate, and impurity concentration in the semiconductor substrate 211 is about $10^{20}$ cm$^{-3}$. Further, in this embodiment, the epitaxial layer 212 is an N-type semiconductor layer, and impurity concentration in the epitaxial layer 212 is about $10^{16}$ cm$^{-3}$. Next, as shown in FIG. 5A, an oxide layer 401 is formed on the epitaxial layer 212.

Figure 5B:
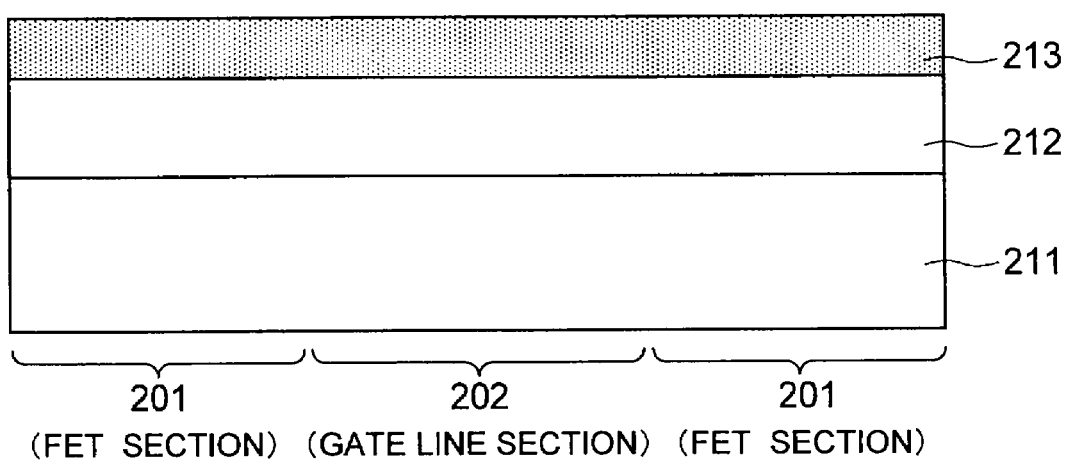

Next, as shown in FIG. 5B, P type impurities are implanted onto the surface of the epitaxial layer 212 to form a base layer 213 in the epitaxial layer 212. The P type impurities are boron, for example. Next, as shown in FIG. 5B, the oxide layer 401 is removed. Next, N type impurities are implanted onto the surface of the epitaxial layer 212 to form a source layer 214 (see FIG. 3) in the epitaxial layer 212. The N-type impurities are arsenic, for example.

Figure 5C:
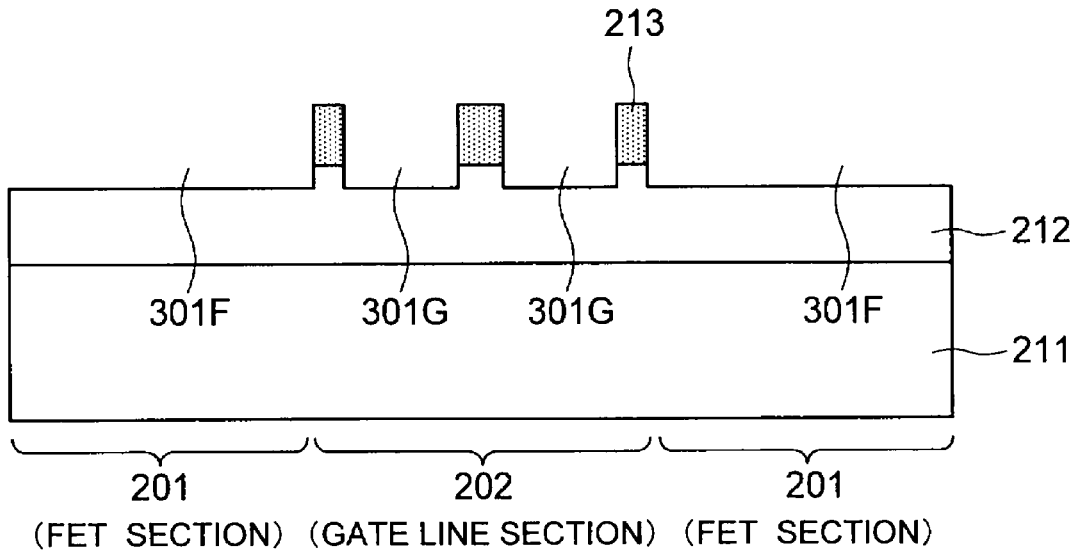

Next, as shown in FIG. 5C, the base layer 213 (epitaxial layer 212) in the FET section 201 and the gate line section 202 are provided with trenches 301 by RIE (Reactive Ion Etching). Thereby, trenches 301F are formed in the FET section 201, and trenches 301G are formed in the gate line section 202. The trenches 301F and the trenches 301G are formed simultaneously by the same etching process in this embodiment. However, they may be formed in order. The depth of the trenches 301G is made substantially equal to the depth of the trenches 301F, by forming the trenches 301F and the trenches 301G simultaneously.

Figure 5D:
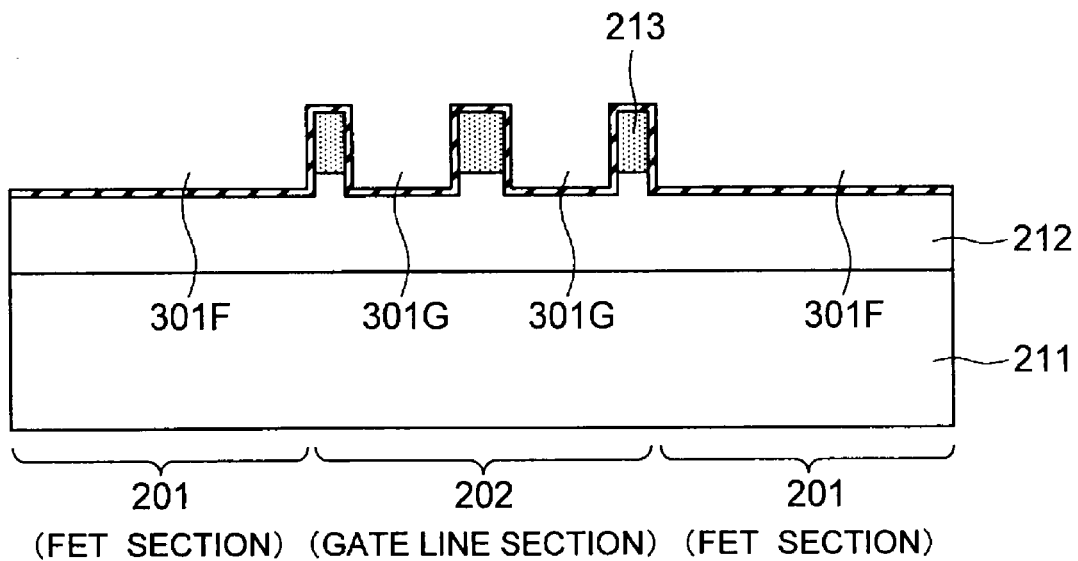

Next, as shown in FIG. 5D, a gate insulator 221 is formed on the base layer 213 by oxidation. The gate insulator 221 is formed on the surfaces of the base layer 213 and the epitaxial layer 212 exposed to the trenches 301F and 301G, on the upper surface of the base layer 213 between the trenches 301G, and on the upper surface of the base layer 213 between the trenches 301G and the trenches 301F. The gate insulator 221 in this embodiment is a silicon oxide layer.

Figure 5E:
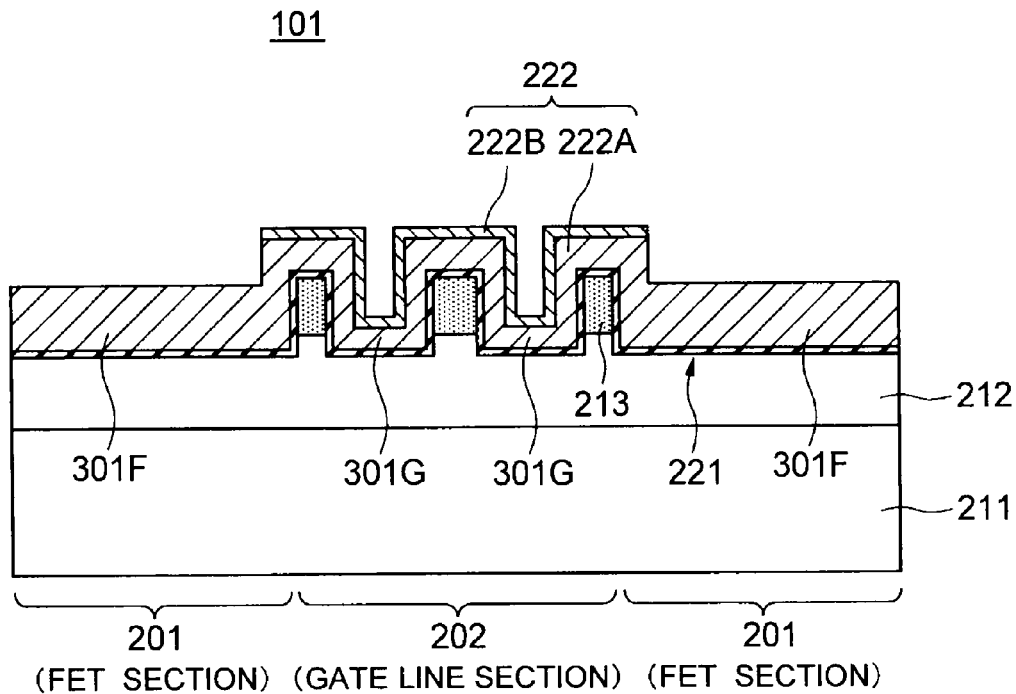

Next, as shown in FIG. 5E, a line layer 222A is formed on the gate insulator 221. The line layer 222A in this embodiment is a polysilicon layer. Next, as shown in FIG. 5E, a line layer 222B is formed on the line layer 222A in the gate line section 202. The line layer 222B in this embodiment is a silicide layer. Thereby, a gate line layer 222 is formed on the gate insulator 221. A part of the gate line layer 222 is buried, as shown in FIG. 3, in the trenches 301F in the FET section 201. In this embodiment, the line layer 222B is not formed on the line layer 222A in the FET section 201. However, the line layer 222B may be formed also on the line layer 222A in the FET section 201. In this embodiment, the line layer 222B is not made remain on the line layer 222A in the FET section 201, so as to prevent resistance from increasing by a thin line effect.

Figure 5F:
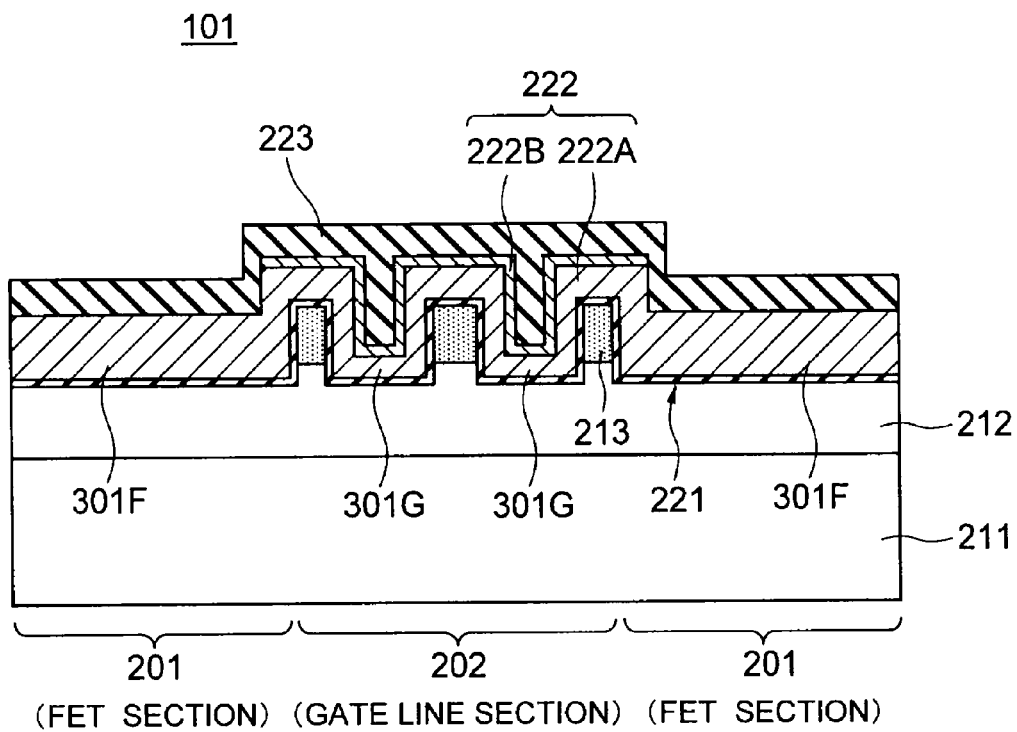

Next, the inter layer dielectric 223 is deposited over the entire surface by CVD. Next, the inter layer dielectric 223 is processed by etching. Thereby, as shown in FIG. 5F, the inter layer dielectric 223 is formed on the gate line layer 222. The inter layer dielectric 223 in this embodiment is a silicon oxide layer. Next, P type impurities are implanted onto the surface of the epitaxial layer 212, and a contact layer 215 (see FIG. 3) is formed in the epitaxial layer 212. The P type impurities in this embodiment are $BF_2$, for example.

Figure 5G:
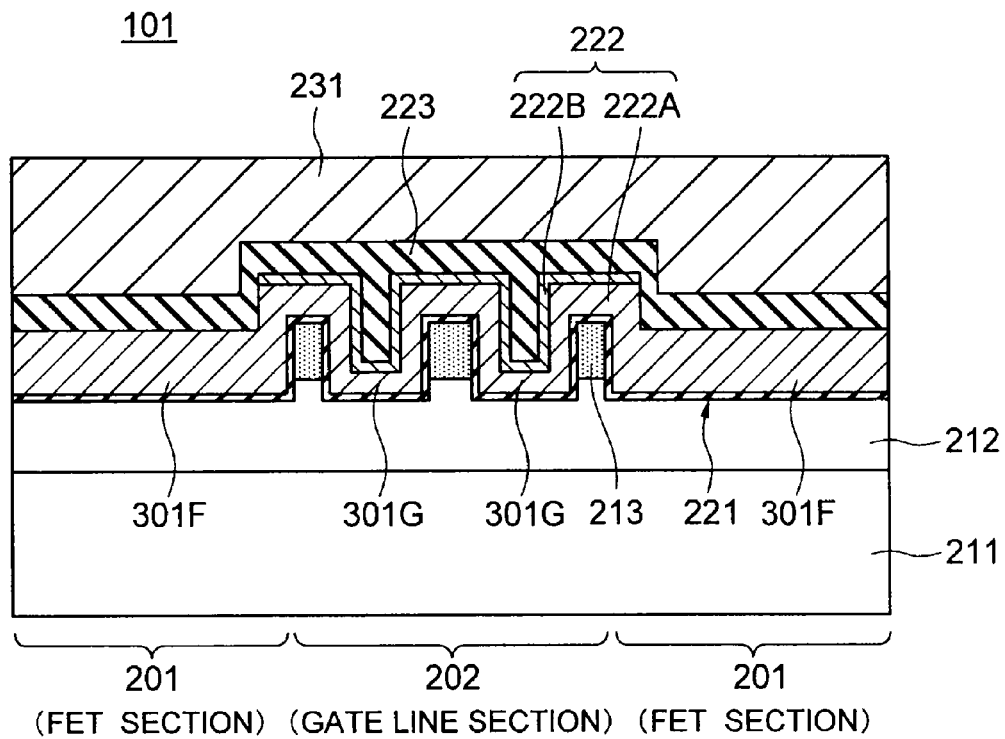

Next, as shown in FIG. 5G, a source metal layer 231 is formed on the inter layer dielectric 223 by sputtering. The source metal layer is electrically connected, as shown in FIG. 3, to the source layer 214 and the contact layer 215 in the FET section 201. The source metal layer 231 in this embodiment is an aluminum layer. Then, in this embodiment, a source strap 132 is electrically connected to the source metal layer 231.

In this embodiment, as shown in FIG. 2, the gate insulator 221, the gate line layer 222, and the inter layer dielectric 223 enter into the trenches 301G in the gate line section 202. In other words, each of the gate insulator 221, the gate line layer 222, and the inter layer dielectric 223 has a part buried in the trenches 301G. In this embodiment, the width of each trench 301G is set at such a value that the gate insulator 221, the gate line layer 222, and the inter layer dielectric 223 can enter into the trenches 301G. Therefore, in this embodiment, it is possible to increase the surface area of the gate line layer 222 in the gate line section 202 by forming the trenches 301G.

A semiconductor device according to a second embodiment will be described. The second embodiment is a variation of the first embodiment, and will be described focusing on differences from the first embodiment.

Second Embodiment

Figure 6:
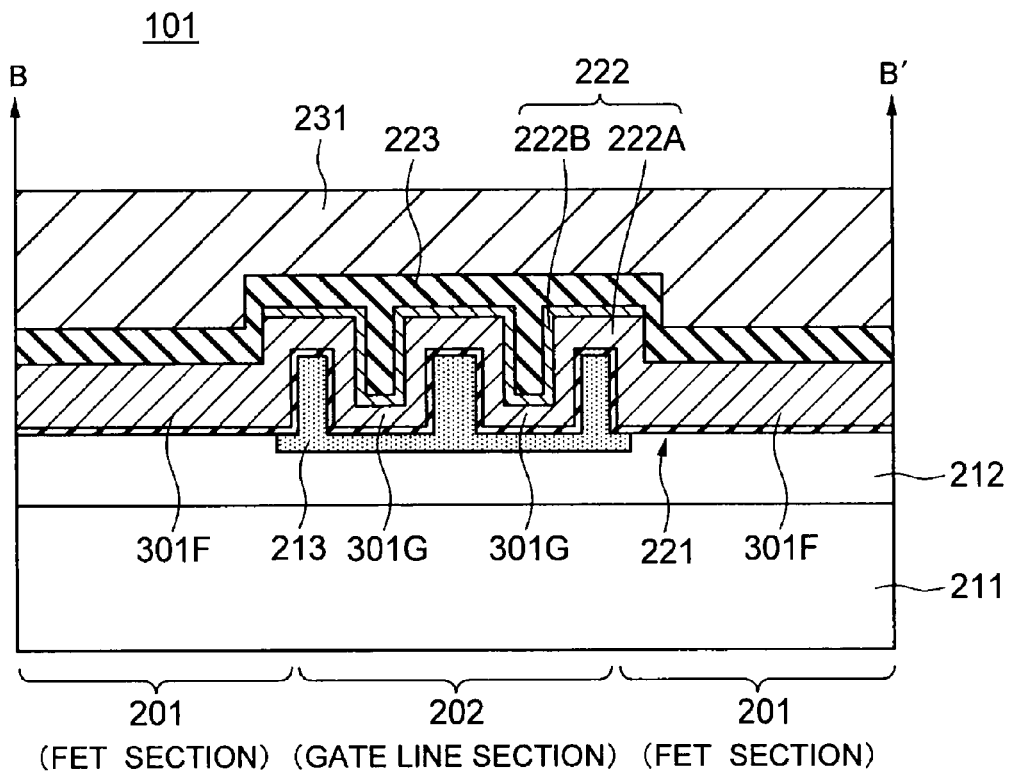
FIG. 6 is a sectional side view of a semiconductor device according to a second embodiment.

FIG. 6 is a sectional side view of a semiconductor device 101 according to a second embodiment. FIG. 6 is a sectional view of the B-B' section in FIG. 1. As shown in FIG. 6, the semiconductor device 101 has an FET section (transistor section) 201 and a gate line section 202.

The semiconductor device 101 includes a semiconductor substrate 211, an epitaxial layer 212 as an example of a semiconductor layer, a base layer 213, a gate insulator 221, a gate line layer 222, an inter layer dielectric 223, and a source metal layer 231 as an example of a source line layer. All of these components are provided in the FET section 201 and gate line section 202. The source metal layer 231 is shown in FIG. 1 as the source metal 131.

In the first embodiment in FIG. 2, the depth of the base layer 213 in the gate line section 202 is shallower than the depth of the trenches 301G in the gate line section 202. For this reason, the trenches 301G protrude from the base layer 213 in FIG. 2. The trenches 301G protruding from the base layer 213 generate feedback capacitors. Therefore, when the MOSFET of the first embodiment is used for high speed switching, there is a possibility that capacity loss becomes large and conversion efficiency becomes low.

On the other hand, in the second embodiment in FIG. 6, the depth of the base layer 213 in the gate line section 202 is deeper than the depth of the trenches 301G in the gate line section 202. For this reason, the trenches 301G do not protrude from the base layer 213 in FIG. 6. Therefore, the problem of the feedback capacitors mentioned above is avoided in the second embodiment.

It is expected that there arises about 10% of error at the maximum between a design value and an actual value of the depth of the trenches 301G. Therefore, in this embodiment, the depth of the base layer 213 in the gate line section 202 is made deeper by 10 to 50% than the depth of the trenches 301G in the gate line section 202. In other words, the depth of the trenches 301G in the gate line section 202 is made shallower by 10 to 33% than the depth of the base layer 213 in the gate line section 202. Thereby, even if the depth of the trenches 301G varies, it is expected that it may not happen that the trenches 301G protrude from the base layer 213.

The depth of the base layer 213 is adjustable in the process in FIG. 5B. Further, the depth of the trenches 301G is adjustable in the process in FIG. 5C. In this embodiment, it is possible to make the depth of the base layer 213 deeper than the depth of the trenches 301G by adjusting the depth of the base layer 213 and the depth of the trenches 301G in these processes. In this embodiment, the depth of the trenches 301G is made shallower than the depth of the base layer 213 in the gate line section 202, by forming the trenches 301G which do not penetrate the base line 213 in the gate line section 202. With respect to other processes in FIGS. 5A to 5G, the first and second embodiments are the same.

In FIG. 2 and FIG. 6, the depth of the base layer 213 in the FET section 201 is shallower than that of the trenches 301F in the FET section 201. For this reason, in FIG. 2 and FIG. 6, the trenches 301F protrude from the base layer 213. In FIG. 6, while the depth of the trenches 301G is substantially the same as that of the trenches 301F, the depth of the base layer 213 in the gate line section 202 is deeper than that of the base layer 213 in the FET section 201. As a result, while the trenches 301G do not protrude from the base layer 213, the trenches 301F protrude from the base layer 213.

Thus, in this embodiment, while the trenches 301F penetrate the base layer 213 to reach the epitaxial layer 212, the trenches 301G do not reach the epitaxial layer 212. In the trenches 301F and 301G, the gate insulator 221 is formed on the surfaces of the base layer 213 and the epitaxial layer 212 exposed to the trenches 301F, and on the surfaces of the base layer 213 exposed to the trenches 301G. Out of the trenches 301F and 301G, the gate insulator 221 is formed on the upper surface of the base layer 213 between the trenches 301G, and on the upper surface of the base layer 213 between the trenches 301G and the trenches 301F.

As described above, according to embodiments of the present invention, a suitable technique for reducing gate resistance is provided with regard to a semiconductor device having a transistor section and a gate line section.

Although examples of specific aspects of the present invention are described above in the first and second embodiments, the present invention is not limited to these embodiments.

The invention claimed is:

1. A semiconductor device having a transistor section which includes a trench gate type transistor, and a gate line section which includes a part provided between transistor sections, the device comprising:
    a semiconductor substrate;
    a semiconductor layer formed on the semiconductor substrate;
    a base layer formed in the semiconductor layer, and provided with trenches in the transistor section and the gate line section, the trenches in the transistor section extending in a first direction parallel to a direction in which the transistor extends, the trenches in the bit line section extending in a second direction perpendicular to the first direction, and the trenches in the transistor section penetrating the base layer to reach the semiconductor layer;
    a source layer formed in the semiconductor layer in the transistor section, the source layer being located on the base layer;
    a gate insulator formed on surfaces of the base layer and the semiconductor layer exposed to the trenches in the transistor section and the gate line section, and on an upper surface of the base layer between the trenches in the gate line section;

a gate line layer formed on the gate insulator, and including a part buried in the trenches in the transistor section;

an inter layer dielectric formed on the gate line layer; and a source line layer formed on the inter layer dielectric, and electrically connected to the source layer in the transistor section.

2. The device according to claim 1, wherein the gate line layer in the gate line section includes two or more line layers having different specific resistances.

3. The device according to claim 2, wherein the gate line layer in the gate line section includes:

a first line layer formed on the gate insulator in the trenches and between the trenches, and including a part buried in the trenches; and a second line layer formed on the first line layer in the trenches and between the trenches, and including a part buried in the trenches, the second line layer having specific resistance lower than that of the first line layer.

4. The device according to claim 3, wherein, the first line layer is a polysilicon layer, and the second line layer is a silicide layer or a metal layer.

5. The device according to claim 1, wherein, the trenches in the gate line section penetrate the base layer to reach the semiconductor layer, and the gate insulator is formed on surfaces of the base layer and the semiconductor layer exposed to the trenches in the transistor section, on surfaces of the base layer and the semiconductor layer exposed to the trenches in the gate line section, and on the upper surface of the base layer between the trenches in the gate line section.

6. The device according to claim 1, wherein, the trenches in the gate line section do not reach the semiconductor layer, and the gate insulator is formed on surfaces of the base layer and the semiconductor layer exposed to the trenches in the transistor section, on surfaces of the base layer exposed to the trenches in the gate line section, and on the upper surface of the base layer between the trenches in the gate line section.

7. The device according to claim 1, wherein the depth of the trenches in the gate line section is substantially the same as the depth of the trenches in the transistor section.

8. The device according to claim 1, wherein the depth of the base layer in the gate line section is deeper than the depth of the trenches in the gate line section.

9. The device according to claim 8, wherein the depth of the base layer in the gate line section is deeper by 10 to 50% than the depth of the trenches in the gate line section.

10. The device according to claim 8, wherein the depth of the base layer in the gate line section is deeper than the depth of the base layer in the transistor section.

11. The device according to claim 1, wherein the depth of the base layer in the transistor section is shallower than the depth of the trenches in the transistor section.

12. The device according to claim 1, wherein, the inter layer dielectric in the gate line section is formed on the gate line layer in the trenches and between the trenches, and includes a part buried in the trenches.

13. The device according to claim 1, wherein, the gate line layer in each of the trenches in the gate line section has a U-shaped cross section, in side section perpendicular to the second direction.

14. The device according to claim 1, further comprising a contact layer formed in the semiconductor layer in the transistor section, the contact layer being located at a side of the source layer on the base layer, wherein the source line layer is electrically connected to the source layer and the contact layer in the transistor section.

15. The device according to claim 1, further comprising a source strap electrically connected to the source line layer.

* * * * *